(12) United States Patent
Matei et al.

(10) Patent No.: US 11,003,823 B2
(45) Date of Patent: May 11, 2021

(54) RE-DESIGN OF ANALOG CIRCUITS

(71) Applicant: Palo Alto Research Center Incorporated, Palo Alto, CA (US)

(72) Inventors: Ion Matei, Sunnyvale, CA (US); Alexander Feldman, Santa Cruz, CA (US); Johan de Kleer, Los Altos, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 50 days.

(21) Appl. No.: 16/059,264

(22) Filed: Aug. 9, 2018

(65) Prior Publication Data

US 2020/0050723 A1 Feb. 13, 2020

(51) Int. Cl.
  *G06F 30/33* (2020.01)
  *G06F 30/367* (2020.01)
  *G06F 17/13* (2006.01)
  *G06F 30/36* (2020.01)
  *G06F 30/392* (2020.01)
  *G06F 30/398* (2020.01)

(52) U.S. Cl.
  CPC ............ *G06F 30/367* (2020.01); *G06F 17/13* (2013.01); *G06F 30/36* (2020.01); *G06F 30/392* (2020.01); *G06F 30/398* (2020.01)

(58) Field of Classification Search
  CPC .. G06F 13/16; G06F 13/4068; G06F 13/4265; G06F 3/0219; G06F 3/0233; G06F 3/0237; G06F 3/0238; G06F 30/36; G06F 21/73; G06F 21/755; G06F 30/39; G06F 30/392; G06F 7/588; G06F 17/13; G06F 2209/5017; G06F 30/30; G06F 30/367; G06F 30/373; G06F 30/398; G06F 9/5033; H01L 27/0207; H01L 2924/1433; H01L 23/528
  USPC .................................. 716/100–106, 136–139
  See application file for complete search history.

(56) References Cited

U.S. PATENT DOCUMENTS

| | | | |
|---|---|---|---|
| 2013/0145337 A1* | 6/2013 | Iyer ..................... | G06F 30/3312 716/134 |
| 2015/0370943 A1* | 12/2015 | Potkonjak ............... | G06F 30/20 716/133 |
| 2016/0171136 A1* | 6/2016 | Iskander ............... | G06F 30/367 716/106 |

OTHER PUBLICATIONS

Noam Shazeer , Azalia Mirhoseini , Krzysztof Maziarz , Andy Davis , Quoc Le , Geoffrey Hinton and Jeff Dean, "Outrageously Large Neural Network: The Sparsely-Gated Mixture of Experts Layer," in the Proceedings of the 5th International Conference on Learning Representations, Apr. 24-26, 2017, Palais des Congrès Neptune, Toulon, France.

(Continued)

*Primary Examiner* — Binh C Tat
(74) *Attorney, Agent, or Firm* — Fay Sharpe LLP

(57) ABSTRACT

The following relates generally to analog circuit re-design. Some embodiments identify a candidate component of the circuit by determining that if the candidate component is adjusted or replaced, the circuit will satisfy a requirement metric. In some implementations, an optimization problem or Bayesian reasoning may be used to change parameters of the candidate component to create a replacement component. In some implementations, a replacement component of a different type than the candidate component may be selected by solving a mixed-integer optimization program or by using a non-linear program with continuous parameters.

8 Claims, 6 Drawing Sheets

(56) References Cited

OTHER PUBLICATIONS

Mu Li, Tong Zhang, Yuqiang Chen, and Alexander J. Smola. 2014. Efficient mini-batch training for stochastic optimization. In Proceedings of the 20th ACM SIGKDD international conference on Knowledge discovery and data mining (KDD '14). ACM, New York, NY, USA, 661-670.

Kingma, D. P. & Ba, J. L (2015). Adam: a Method for Stochastic Optimization. International Conference on Learning Representations, 1-13.

Dozat, T. (2016). Incorporating Nesterov Momentum into Adam. ICLR Workshop, (1), 2013-2016.

Alan C. Hindmarsh, Peter N. Brown, Keith E. Grant, Steven L. Lee, Radu Serban, Dan E. Shumaker, and Carol S. Woodward. 2005. Sundials: Suite of nonlinear and differential/algebraic equation solvers. ACM Trans. Math. Softw. 31, 3 (Sep. 2005), 363-396.

Rall, Louis B. (1981). Automatic Differentiation: Techniques and Applications. Lecture Notes in Computer Science, Springer, ISBN 3-540-10861-0.

M. S. Arulampalam, S. Maskell, N. Gordon and T. Clapp, "A tutorial on particle filters for online nonlinear/non-Gaussian Bayesian tracking," in IEEE Transactions on Signal Processing, vol. 50, No. 2, pp. 174-188, Feb. 2002.

Tibshirani, Robert, "Regression Shrinkage and Selection via the lasso". Journal of the Royal Statistical Society. Series B (methodological). Wiley. 58 (1): 267-88, 1996.

Noura, H., Theilliol, D., Ponsart, J.-C., Chamseddine, A., "Fault-tolerant Control Systems: Design and Practical Applications," Springer, 2009, ISBN: 978-1-84882-652-6.

Ion Matei, Johan de Kleer and Raj Minhas, "Learning constitutive equations of physical components with constraints discovery", (Jun. 27-29, 2018).

\* cited by examiner

RE-DESIGN OF ANALOG CIRCUITS

BACKGROUND

The present application relates generally to analog circuit re-design.

Currently, there are many tools available for the design of analog circuits. However, there are few tools available for re-design of analog circuits. The following addresses this problem and others in the art by providing a new and improved tool for re-design of analog circuits.

BRIEF DESCRIPTION

The following proposes a diagnosis-based re-design method for analog circuits that fail to satisfy requirement metrics as a result of design errors, where the metrics are defined in terms of passing functional tests. The problem of isolating a design error in an analog circuit can be formulated as learning from test cases. A diagnosis algorithm identifies the candidate components of the circuit that, if adjusted or replaced, will make the circuit satisfy the requirement metrics.

As will be described herein, two strategies are pursued for repairing the design errors. In the first strategy, a large-scale optimization problem is formulated where the optimization variables are parameters of the candidate components. The objective function is defined in terms of the requirement metrics. Further, it is to be understood that the objective function is an optimization problem. The solution of the optimization problem is a new set of component parameters, hence a new design solution for the circuit. To deal with a possible large number of component parameters, some embodiments leverage deep learning technology, where the learning algorithms can deal with millions of parameters. Large-scale optimization algorithms are based on first order methods that use the gradient of the cost function only, since second order methods that compute and invert second order derivatives are intractable at such large scales. Scalability is further improved by using mini-batch optimization where parameter updates are iteratively executed on subsets of the test case data. Convergence rate increases are achieved by employing adaptive learning rates for different parameters from estimates of first and second moments of the gradients. In some embodiments, to accommodate parameter constraints, projected gradient-based algorithms are used instead. Gradient-based methods use gradient evaluations to update parameters. Hence the gradients need to be available. There are several avenues for evaluating gradients. As gradients can be expressed in terms of the sensitivity of the circuit variables in terms of the parameters, some implementations use numerical solvers that include such capabilities. Alternatively, it is possible to use automatic differentiation of the optimization objective function that can accommodate highly complex functions.

The second strategy adds the possibility of replacing a candidate component or components with a different component or components from a pre-defined library. The re-design problem is formulated as a mixed-integer optimization problem (e.g., an optimization problem where some of the variables are constrained to be integers and other variables are not constrained to be integers) whose solution is a set of components that will replace the candidate components and their parameter values. Mixed-integer optimization problems are hard to solve, especially in the case of large-scale optimization problems. Some embodiments convert the mixed-integer optimization problem into a non-linear program with (possibly constrained) continuous parameters by replacing electrical switches in a selected replacement component with resistors (or conductors) of unknown resistance (or conductance) values. By adding sparsity constraints on the resistance values, the effects of electrical switches can be mimicked.

In accordance with one aspect of the present application, there is an apparatus for re-designing a circuit, and the apparatus comprises: at least one processor; and at least one memory including computer program code. The at least one memory and the computer program code may be configured to, with the at least one processor, cause the apparatus at least to: identify a candidate component of the circuit by determining that if the candidate component is adjusted or replaced, the circuit will satisfy a requirement metric; change parameters of the candidate component to create a replacement component; and re-design the circuit by replacing the candidate component with the replacement component.

In the apparatus as described in the preceding paragraph, the at least one processor may be configured to execute the computer-readable instructions to cause the apparatus to make the change of the parameters of the candidate component by optimizing the parameters by solving an optimization problem where the parameters are variables of the optimization problem. The at least one processor may be configured to execute the computer-readable instructions to cause the apparatus to make the change of the parameters of the candidate component by optimizing the parameters by using a gradient of a cost function. The at least one processor may be configured to execute the computer-readable instructions to cause the apparatus to make the change of the parameters of the candidate component by optimizing the parameters by using the equation $\theta_{t+1}=\theta_t-\theta\nabla f(\theta_t)$, where $\theta$ is a vector of parameters, $a$ denotes a learning rate and $\nabla f(\theta)$ is the gradient of a cost function $f(\theta)$. The at least one processor may be configured to execute the computer-readable instructions to cause the apparatus to make the change of the parameters of the candidate component by optimizing the parameters by using use mini-batch optimization by iteratively executing parameter updates on subsets of test case data of the circuit. In some implementations, the at least one processor: includes a graphics processing unit (GPU); and is configured to execute the computer-readable instructions to cause the apparatus to: make the change of the parameters of the candidate component by optimizing the parameters by solving an optimization problem where the parameters are variables of the optimization problem; and push computationally intensive subroutines to the GPU. The at least one processor may be configured to execute the computer-readable instructions to cause the apparatus to make the change of the parameters of the candidate component based on Bayesian reasoning. The circuit may be an analog circuit. Alternatively, the circuit may be a mixed digital-analog circuit, and the at least one processor may be configured to execute the computer-readable instructions to cause the apparatus to use a common language to represent the mixed digital-analog circuit.

In another aspect, there is an apparatus for re-designing a circuit, comprising: at least one processor; and at least one memory including computer program code. The at least one memory and the computer program code may be configured to, with the at least one processor, cause the apparatus at least to: identify a candidate component of the circuit by determining that if the candidate component is adjusted or replaced, the circuit will satisfy a requirement metric; identify a replacement component by solving a mixed integer problem; optimize the replacement component by solving an optimization problem; and re-design the circuit by replacing the candidate component with the optimized replacement component.

In the apparatus as described in the preceding paragraph, the at least one processor may be configured to execute the computer-readable instructions to cause the apparatus to identify the replacement component from a library. The replacement component may include a plurality branches with a switch attached to each branch. In one implementation, the candidate component comprises a resistor; and the replacement component includes a resistor, a capacitor, and an inductor.

In another aspect, there is an apparatus for re-designing a circuit, comprising: at least one processor; and at least one memory including computer program code. The at least one memory and the computer program code may be configured to, with the at least one processor, cause the apparatus at least to: identify a candidate component of the circuit by determining that if the candidate component is adjusted or replaced, the circuit will satisfy a requirement metric; using a non-linear program with continuous parameters: identify a replacement component; and optimize the replacement component by replacing electrical switches of the replacement component with resistors of unknown resistance values; and re-design the circuit by replacing the candidate component with the optimized replacement component.

In the apparatus as described in the preceding paragraph, the at least one processor may be configured to execute the computer-readable instructions to cause the apparatus to add sparsity constraints to the unknown resistance values to mimic the effect of electrical switches. In one implementation, the candidate component is a first candidate component; and the at least one processor is configured to execute the computer-readable instructions to cause the apparatus to: identify a second candidate component of the circuit by determining that if the second candidate component is adjusted or replaced, the circuit will satisfy the requirement metric; and using the non-linear program with continuous parameters, perform the identification and the optimization of the replacement component by replacing the electrical switches of the candidate component with the resistors of unknown resistance values such that the replacement component is identified and optimized to replace both the first candidate component and the second candidate component.

Advantageously, some embodiments re-use an almost correct design as a starting point to generate a new design that meets specifications. Hence, they achieve cost savings by having to re-design the electronic circuit from scratch.

DETAILED DESCRIPTION

The system and methods described herein detect and repair errors in analog circuits that do not pass functional tests. Some embodiments use model-based diagnosis (MBD) techniques to identify candidate components. The candidate components are circuit components responsible for the circuit's failure to pass the functional tests. If adapted or replaced, the circuit will behave as expected. Some implementations work under the assumption that sufficient information for rectifying the design is contained in the functional tests. In classic MBD, the goal is to detect and isolate physical faults that can affect a system during operation. The same machinery, however, can be used to isolate design faults. MBD checks if a design passes all the specified tests.

Figure 1A:
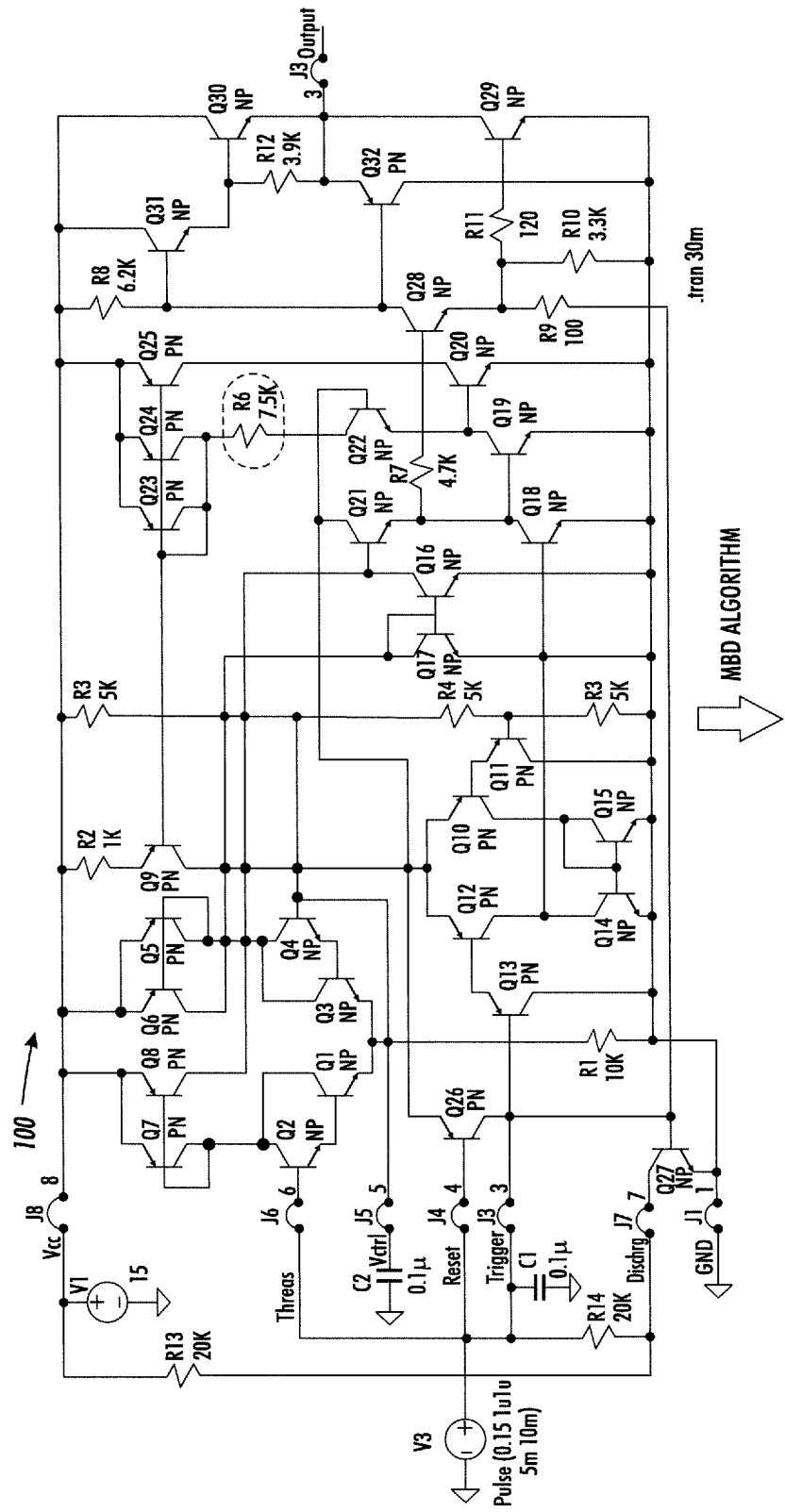
FIGS. 1A and 1B illustrate an embodiment of running a model-based diagnosis (MBD) algorithm on a circuit to identify components that should be adapted or replaced.
Figure 1B:
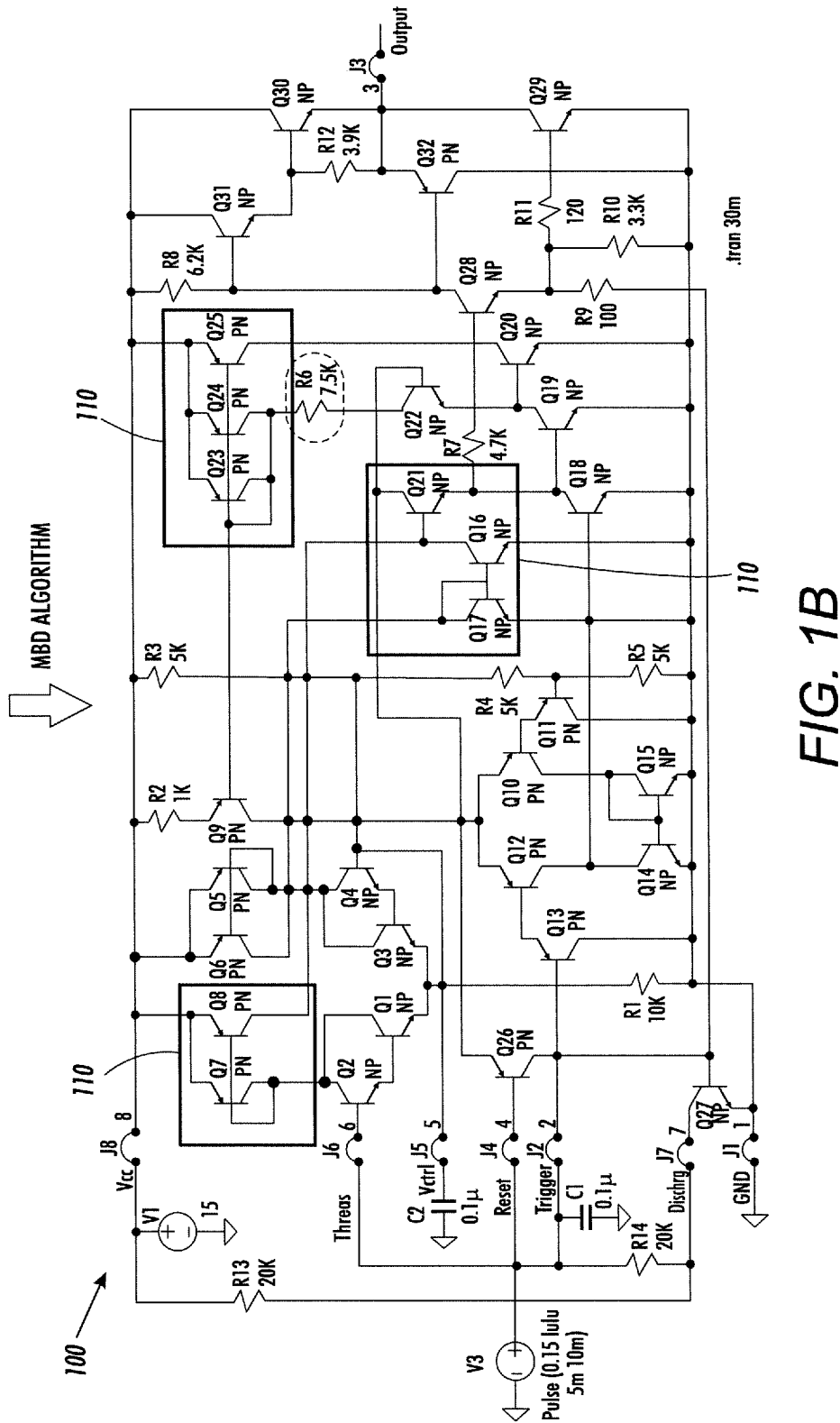

FIG. 1A shows circuit 100. When an MBD algorithm is run on the circuit 100, as shown by FIG. 1B, a set of candidate components 110 is generated that, if adapted or replaced, the circuit 100 will pass the functional tests.

Embodiments described herein also compute the location of the failure (in the original circuit design). The algorithm for automatic localization of faults computes the smallest schematic fragments that, when modified, makes the functional test-suite pass. In the case of multiple design errors, MBD identifies a set of such smallest fragments. It is possible to have more than one multiple-fault diagnosis consistent with an observation. In this case, the fault-diagnosis algorithm computes all of them and computes the posteriori probability of each fault by applying Bayesian reasoning. Having identified the component responsible for failing the functional tests, the algorithm proceeds with the re-design problem. From here, there are two approaches: the first approach is to preserve the structure, that is, keep the same type of components but search for better component parameters; or, the second approach is to change the structure of the circuit by adding or removing components, and learning their parameters when applicable.

Both approaches can be formulated as learning problems to which functional tests are fed. In the case of the first approach, the learning process determines how to change the parameters of one or several components so that the requirement metrics are satisfied. Several methods may be used that range from optimization based methods to Bayesian reasoning. All methods face the challenge of dealing with very large number of parameters. In the case of the optimization based method, some embodiments leverage deep learning, where the learning algorithms can deal with millions of parameters (Noam Shazeer, Azalia Mirhoseini, Krzysztof Maziarz, Andy Davis, Quoc Le, Geoffrey Hinton and Jeff Dean, "Outrageously Large Neural Network: The Sparsely-Gated Mixture of Experts Layer," in the Proceedings of the 5th International Conference on Learning Representations, Apr. 24-26, 2017, Palais des Congres Neptune, Toulon, France). The large-scale optimization algorithms are based on first order methods that use the gradient of the cost function only, since the computation of first-order partial derivatives with respect to all the parameters is of the same computational complexity as just evaluating the function:

$$\theta_{t+1} = \theta_t - \alpha \nabla f(\theta_t)$$

where $\theta$ is the vector of parameters, $\alpha$ denotes the learning rate and $\nabla f(\theta)$ is the gradient of the cost function $f(\theta)$. Second order methods such as the Newton's algorithm are infeasible to compute in practice for high-dimensional data sets. To improve scalability, some embodiments use mini-batch optimization where parameter updates are iteratively executed on subsets of the test case data. (Mu Li, Tong Zhang, Yuqiang Chen, and Alexander J. Smola. 2014. Efficient mini-batch training for stochastic optimization. In Proceedings of the 20th ACM SIGKDD international conference on Knowledge discovery and data mining (KDD '14). ACM, New York, N.Y., USA, 661-670). Convergence rate increases are achieved by employing adaptive learning rates for different parameters from estimates of first and second moments of the gradients. Examples of such algorithms include: gradient decent with momentum, Nesterov accelerated gradient, RMSprop, Adam, Nadam. (Kingma, D. P., & Ba, J. L. (2015). Adam: a Method for Stochastic Optimization. International Conference on Learning Representations, 1-13; and Dozat, T. (2016). Incorporating Nesterov Momentum into Adam. ICLR Workshop, (1), 2013-2016). Optimization algorithms' efficiency can be further improved by using both multi-core processing and GPU where all cores share the GPU and computationally intensive subroutines are pushed to the GPU. Unlike standard machine learning algorithms, component parameters may be constrained to take values in some set (resistances are always positive). To accommodate parameter constraints, projected gradient-based algorithms will be used instead. Gradient-based methods use gradient evaluations to update parameters. Hence the gradients need to be available. The systems and methods described herein use several avenues for evaluating gradients. As gradients can be expressed in terms of the sensitivity of the circuit variables in terms of the parameters, some embodiments use numerical solvers that include such capabilities, e.g. CVODES (Alan C. Hindmarsh, Peter N. Brown, Keith E. Grant, Steven L. Lee, Radu Serban, Dan E. Shumaker, and Carol S. Woodward. 2005. SUNDIALS: Suite of nonlinear and differential/algebraic equation solvers. ACM Trans. Math. Softw. 31, 3 [September 2005], 363-396). Alternatively, some embodiments use automatic differentiation of the optimization objective function that can accommodate highly complex function (Rall, Louis B. (1981). Automatic Differentiation: Techniques and Applications. Lecture Notes in Computer Science, Springer, ISBN 3-540-10861-0). When the previous two approaches are not applicable, numerical approximations are used. For example, it can happen that using the automatic differentiation is a very slow procedure. Hence, in this situation, we can choose to use numerical approximations. Also, the automatic differentiation is done using a set of standard operators. If the problem contains operators that are not within this set, then it is not possible use automatic differentiation. Projected gradient methods require knowledge about the parameter constraints. These constraints are not always known in advance. Some embodiments build on recent results of learning physical components (Ion Matei, Johan de Kleer and Raj Minhas, "Learning constitutive equations of physical components with constraints discovery", submitted for publication to the 2018 IEEE American Control Conference), and design an explore-exploit procedure for joint parameters and constraints learning. The procedure favors exploration during the first iterations. This enables learning a model for the constraints. As the constraints learning advances more weight is given to finding the component parameters. Learning parameter constraints will benefit any future parameter-based redesign process, making it more efficient.

To further explain the improvements in efficiency that may be achieved using GPUs, consider that GPUs are processing units that have thousands of cores. The gain in efficiency is reached by parallelizing the computations. This particularly useful in mini-batch cases, when the evaluation of the cost function and the gradients can be parallelized and done on the GPU. The management of the GPU operations is done automatically. Platforms such as Tensorflow or PyTorch are designed to allow the use of a GPU if present.

If a GPU is not available, most CPU are multicore, and some gain can be achieved by making parallelizing the operations and running them on multiple cores simultaneously.

An alternative to optimization based learning is Bayesian reasoning, where the goal is to estimate the probability distribution of the parameters given the test cases. Among the Bayesian reasoning methods, the particle filter (M. S. Arulampalam, S. Maskell, N. Gordon and T. Clapp, "A tutorial on particle filters for online nonlinear/non-Gaussian Bayesian tracking," in IEEE Transactions on Signal Processing, vol. 50, no. 2, pp. 174-188, February 2002) is an ideal candidate since it can deal with hybrid, non-linear systems, non-Gaussian noise distributions, and its complexity is linear in the number of particles. It supports mini-batch implementation where the parameters are updated by sequentially adding new test cases. The algorithm efficiency can be improved by parallelizing the particle trajectory evaluations.

Figure 4:
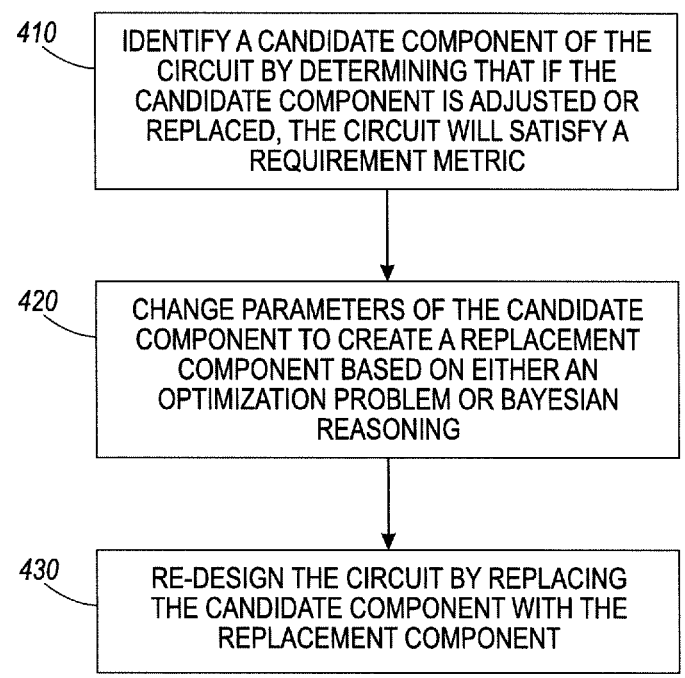
FIG. 4 illustrates an example of a first approach in accordance with the systems and methods described herein.

To summarize the first approach, FIG. 4 shows an embodiment of the first approach. In step 410, a candidate component of the circuit is identified by determining that if the candidate component is adjusted or replaced, the circuit will satisfy a requirement metric. In step 420, parameters of the candidate component are changed based on either an optimization problem or Bayesian reasoning to create a replacement component. In step 430, the circuit is re-designed by replacing the candidate component with the replacement component.

Moving on, the second approach will now be described. The second approach for re-design includes possible structural changes (adding or removing sub-components) so that the circuit passes the functional tests. An example of this is depicted in FIGS. 1A and 1B. Instead of having one fixed sub-component in the model, it is proposed introduce the possibility of switching between multiple components and choosing appropriate parameters for them when applicable. This is done by replacing a sub-component (e.g., a resistor in the example of FIG. 2, which will be discussed in the paragraphs that follow) with an augmented sub-component that includes electrical components from a pre-defined library. On each branch of the augmented sub-component electrical switches are attached.

Figure 2:
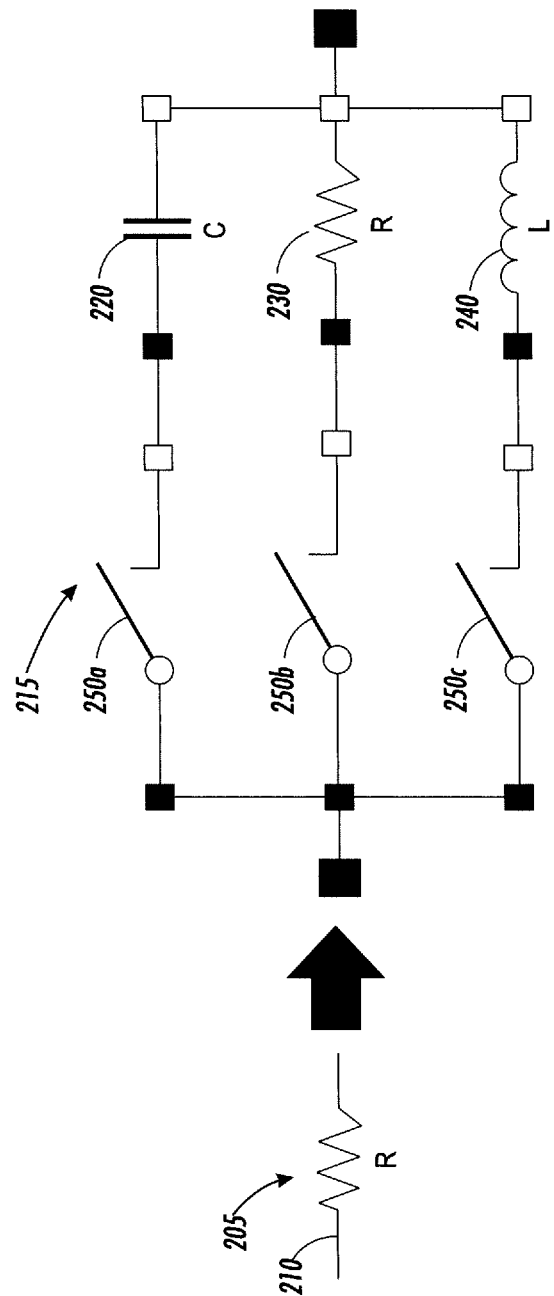
FIG. 2 illustrates model augmentation for structural re-design.

FIG. 2 shows model augmentation for structural re-design. In the example of FIG. 2, the candidate component 205 is a resistor 210. In this example, the algorithm chooses a replacement for resistor 210 from a library of components (the library is not shown in FIG. 2), and computes the parameters of the replacement component 215. Further in the example of FIG. 2, the replacement component 215 includes capacitor 220, resistor 230, inductor 240, and switches 250*a*, 250*b*, 250*c*. The re-design problem can be posed as a mixed-integer optimization problem, where it is decided what switches to turn on/off and what parameter values should be chosen for the newly introduced sub-components to satisfy the requirement metrics. In some embodiments, a mixed-integer problem is first solved to identify a replacement component or sub-component, and the identified component is then subsequently optimized.

Mixed-integer optimization problems are hard to solve (e.g., because of the computational complexity that is often involved), especially in the case of large scale optimization problems. Some embodiments convert the mixed-integer optimization problem into a non-linear program with (possibly constrained) continuous parameters by replacing the electrical switches with resistors of unknown resistance values. By adding sparsity constraints (e.g., least absolute shrinkage and selection operator (LASSO) [Tibshirani, Robert, "Regression Shrinkage and Selection via the lasso". Journal of the Royal Statistical Society. Series B (methodological). Wiley. 58 (1): 267-88, 1996.]) on the resistance values, it is possible to mimic the effects of electrical switches.

Figure 5A:
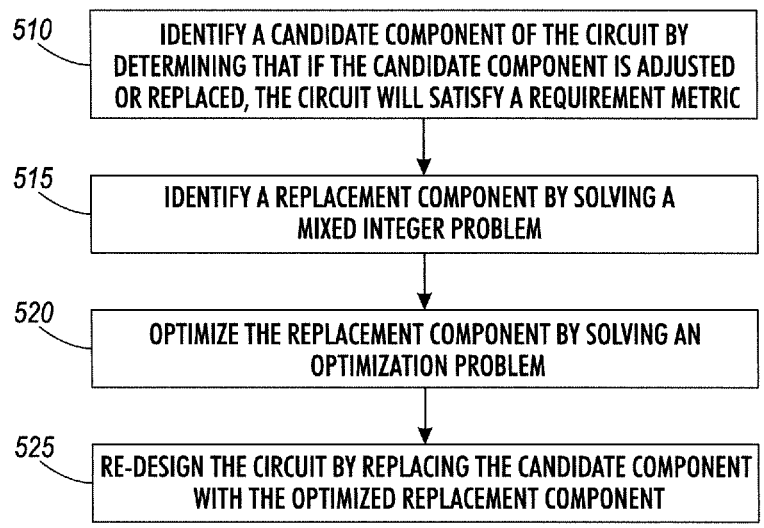
FIGS. 5A and 5B illustrate examples of implementations of a second approach in accordance with the systems and methods described herein.
Figure 5B:
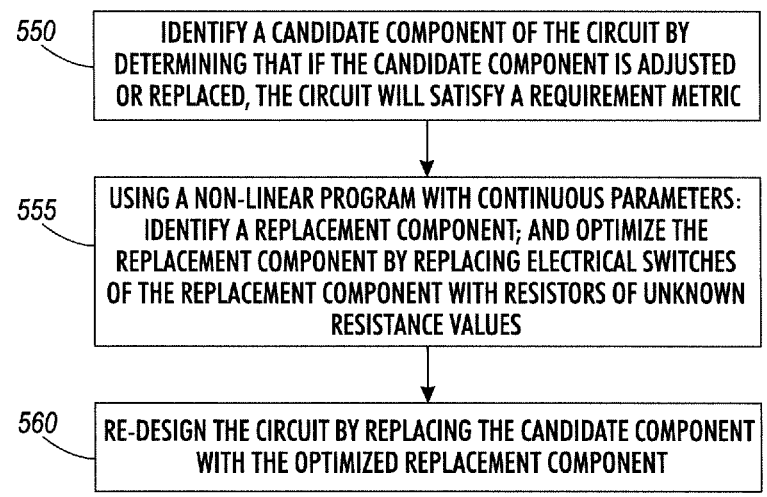

In summary of the second approach, FIGS. 5A-5B show examples of implementations of the second approach. In FIG. 5A, in step 510, a candidate component of the circuit is identified by determining that if the candidate component is adjusted or replaced, the circuit will satisfy a requirement metric. In step 515, a replacement component is identified by solving a mixed integer problem. In step 520, the replacement component is optimized by solving an optimization problem. In step 525, the circuit is re-designed by replacing the candidate component with the optimized replacement component.

In FIG. 5B, in step 550, a candidate component of the circuit is identified by determining that if the candidate component is adjusted or replaced, the circuit will satisfy a requirement metric. In step 555, using a non-linear program with continuous parameters, a replacement component is identified, and is optimized by replacing electrical switches of the replacement component with resistors of unknown resistance values. In step 560, the circuit is re-designed by replacing the candidate component with the optimized replacement component.

The approaches described herein also result in scalability improvements by localized re-design. The re-design problem as described above relies on large-scale optimization and numerical simulation of models with a very large number of parameters. The MBD algorithm provides a list of candidate components that, if changed appropriately, will result in the circuit passing the functional tests. The changes are guided by a set of test-cases that describe the desired behavior of the circuit. Rather than considering the re-design problem from the perspective the entire analog circuit, some embodiments instead formulate a localized re-design problem based on estimated local functional tests for the candidate components. The main challenge is learning the local functional tests. Some embodiments use diagnosis algorithms that in addition to localizing the fault source, they estimate the fault magnitude as well. Such algorithms are based on observers with unknown inputs, decoupled filters, or singular value decomposition (Noura, H., Theilliol, D., Ponsart, J.-C., Chamseddine, A., "Fault-tolerant Control Systems: Design and Practical Applications," Springer, 2009, ISBN: 978-1-84882-652-6). Consider FIG. 3, where component C3 with input u3 and output y3 was found to be a candidate for re-design. The diagnosis algorithm will also estimate the error $\Delta y_3$ introduced by C3 that prevent the circuit 300 from passing the functional tests. The quantity $\Delta y_3$ represents from the perspective of the algorithm the fault magnitude.

Figure 3:
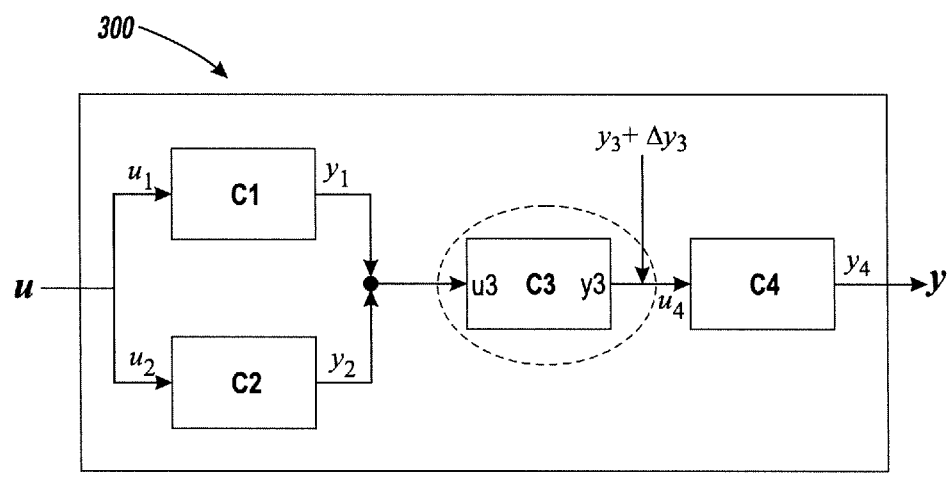
FIG. 3 illustrates an example of diagnosis-based re-design candidate with local test-case learning.

FIG. 3 shows diagnosis-based re-design candidate with local test-case learning. With reference to FIG. 3, the pairs (u3, y3+$\Delta y_3$) will represent estimated local functional test for C3, and one of the methods described above can be used for re-design. The complexity of the re-design process is significantly reduced since only the component C3 must be simulated and not the entire circuit. Further scalability improvements can be achieved by learning abstractions of the components that are not present in the candidate set. For example, this would mean that components C1 and C2 are replaced by another component C12 that is simpler.

In addition, it should be noted that some embodiments extend to mixed digital-analog circuit re-design by using a common language to represent the mixed circuit.

It will be further appreciated that the techniques disclosed herein may be embodied by a non-transitory storage medium storing instructions readable and executable by an electronic data processing device to perform the disclosed techniques. Such a non-transitory storage medium may comprise a hard drive or other magnetic storage medium, an optical disk or other optical storage medium, a cloud-based storage medium such as a RAID disk array, flash memory or other non-volatile electronic storage medium, or so forth.

Of course, modifications and alterations will occur to others upon reading and understanding the preceding description. It is intended that the invention be construed as including all such modifications and alterations insofar as they come within the scope of the appended claims or the equivalents thereof.

The invention claimed is:

1. An apparatus for re-designing an analog circuit, comprising:
   at least one processor;
   at least one memory including computer program code; and
   the at least one memory and the computer program code configured to, with the at least one processor, cause the apparatus at least to:
   analyze a design of the analog circuit in order to identify a candidate component of the analog circuit by determining that if the candidate component is adjusted or replaced, the analog circuit will satisfy a requirement metric;
   change parameters of the candidate component wherein the at least one processor is configured to execute the computer program code to cause the apparatus to make the change of the parameters of the candidate component by optimizing the parameters using the equation $\theta_{t+1}=\theta_t-\alpha \nabla f(\theta_t)$, where $\theta$ is a vector of parameters, $\alpha$ denotes a learning rate and $\nabla f(\theta)$ is the gradient of a cost function $f(\theta)$ to create a replacement component; and
   re-design the analog circuit to generate a new analog circuit design by replacing the candidate component with the replacement component.

2. The apparatus of claim 1, wherein the at least one processor is configured to execute the computer-readable instructions to cause the apparatus to make the change of the parameters of the candidate component by optimizing the parameters by solving an optimization problem where the parameters are variables of the optimization problem.

3. The apparatus of claim 1, wherein the at least one processor is configured to execute the computer-readable instructions to cause the apparatus to make the change of the parameters of the candidate component by optimizing the parameters by using a gradient of a cost function.

4. The apparatus of claim 3, wherein the at least one processor:
   includes a graphics processing unit (GPU); and
   is configured to execute the computer-readable instructions to cause the apparatus to make the change of the parameters of the candidate component by:
   evaluating the cost function and the gradient by parallelizing the cost function and the gradient on the GPU.

5. The apparatus of claim 1, wherein the at least one processor is configured to execute the computer-readable instructions to cause the apparatus to make the change of the parameters of the candidate component by optimizing the parameters by using use mini-batch optimization by iteratively executing parameter updates on subsets of test case data of the analog circuit.

6. The apparatus of claim 1, wherein the at least one processor:
   includes a graphics processing unit (GPU); and
   is configured to execute the computer-readable instructions to cause the apparatus to:
   make the change of the parameters of the candidate component by optimizing the parameters by solving an optimization problem where the parameters are variables of the optimization problem; and
   push computationally intensive subroutines to the GPU.

7. The apparatus of claim 1, wherein the at least one processor is configured to execute the computer-readable instructions to cause the apparatus to make the change of the parameters of the candidate component based on Bayesian reasoning.

8. The apparatus of claim 1, wherein the analysis includes determining a smallest schematic fragment of the analog circuit that when adjusted or replaced causes the analog circuit to satisfy the requirement metric, said smallest schematic fragment being identified as the candidate component.

\* \* \* \* \*